United States Patent
Mahameed et al.

(10) Patent No.: US 9,150,402 B2
(45) Date of Patent: Oct. 6, 2015

(54) MEMS DEVICES UTILIZING A THICK METAL LAYER OF AN INTERCONNECT METAL FILM STACK

(71) Applicants: Rashed Mahameed, Beaverton, OR (US); Kristen L. Dorsey, Pittsburgh, PA (US); Mamdouh O. M M Abdelmejeed, Alexandria (EG); Mohamed A. Abdelmoneum, Portland, OR (US)

(72) Inventors: Rashed Mahameed, Beaverton, OR (US); Kristen L. Dorsey, Pittsburgh, PA (US); Mamdouh O. M M Abdelmejeed, Alexandria (EG); Mohamed A. Abdelmoneum, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/127,536

(22) PCT Filed: Aug. 23, 2013

(86) PCT No.: PCT/US2013/056431
§ 371 (c)(1),
(2) Date: Dec. 19, 2013

(87) PCT Pub. No.: WO2015/026368
PCT Pub. Date: Feb. 26, 2015

(65) Prior Publication Data
US 2015/0145075 A1 May 28, 2015

(51) Int. Cl.
*H01L 21/20* (2006.01)
*B81B 3/00* (2006.01)
*B81C 1/00* (2006.01)

(52) U.S. Cl.
CPC ........... *B81B 3/0021* (2013.01); *B81C 1/00166* (2013.01); *B81B 2201/0235* (2013.01); *B81B 2201/0242* (2013.01); *B81B 2203/0145* (2013.01)

(58) Field of Classification Search
CPC ................ H01L 21/28194; H01L 21/3141; H01L 23/4824; H01L 23/49589; H01L 27/0629; H01L 27/0922; H01L 27/0924; H01L 28/40; H01L 21/8329
USPC ......... 438/381, 240, 243, 253, 396, 386, 487, 438/729; 257/296, 301, 389, E21.006, 257/E21.007, E21.084, E21.267, E21.396, 257/E21.475, E21.499, E21.632, E21.645, 257/E21.646
See application file for complete search history.

(56) References Cited

U.S. PATENT DOCUMENTS 5,594,171 A * 1/1997 Ishida et al. ............... 73/514.32
5,665,915 A * 9/1997 Kobayashi et al. ........ 73/514.32
(Continued)

OTHER PUBLICATIONS

International Search Report and Written Opinion received for PCT Application No. PCT/US2013/056431, mailed on May 23, 2014, 15 pages.

*Primary Examiner* — David Nhu
(74) *Attorney, Agent, or Firm* — Green, Howard & Mughal, LLP

(57) ABSTRACT

A MEMS device, such as an accelerometer or gyroscope, fabricated in interconnect metallization compatible with a CMOS microelectronic device. In embodiments, a proof mass has a first body region utilizing a thick metal layer that is separated from a thin metal layer. The thick metal layer has a film thickness that is significantly greater than that of the thin metal layer for increased mass. The proof mass further includes a first sensing structure comprising the thin metal layer, but lacking the thick metal layer for small feature sizes and increased capacitive coupling to a surrounding fame that includes a second sensing structure comprising the thin metal layer, but also lacking the thick metal layer. In further embodiments, the frame is released and includes regions with the thick metal layer to better match film stress-induced static deflection of the proof mass.

20 Claims, 9 Drawing Sheets

(56) References Cited

U.S. PATENT DOCUMENTS

| | | | |
|---|---|---|---|
| 5,830,777 A * | 11/1998 | Ishida et al. | 438/50 |
| 6,286,369 B1 * | 9/2001 | Yazdi et al. | 73/514.32 |
| 7,005,193 B2 * | 2/2006 | McNeil et al. | 428/450 |
| 8,479,576 B2 * | 7/2013 | Wang | 73/514.32 |
| 2004/0219340 A1 | 11/2004 | McNeil et al. | |
| 2004/0231420 A1 | 11/2004 | Xie et al. | |
| 2011/0115035 A1 | 5/2011 | Huang et al. | |
| 2012/0167683 A1 | 7/2012 | Wang | |

* cited by examiner

MEMS DEVICES UTILIZING A THICK METAL LAYER OF AN INTERCONNECT METAL FILM STACK

This application is a 371 application of, and claims priority to PCT Patent Application Ser. No. PCT/US2013/056431, filed on 23 Aug. 2013, titled "MEMS DEVICES UTILIZING A THICK METAL LAYER OF AN INTERCONNECT METAL FILM STACK."

TECHNICAL FIELD

Embodiments of the invention generally relate to Micro-ElectroMechanical Systems (MEMS), and more particularly relate to MEMS accelerometers and gyroscopes utilizing a thick metal layer of an integrated circuit (IC) interconnect metal film stack.

BACKGROUND

MEMS technology is employed in many sensors, such as accelerometers, and gyroscopes. Many MEMS employ a released proof mass that is to experience a physical displacement relative to a substrate, or frame relatively more rigidly coupled to the substrate, in response to an external stimulus. Detection of this physical displacement may be detrimentally impacted by insufficient mass and/or residual stresses in the MEMS structure, particularly stress gradients across a metal film thickness, which cause a structure to statically deflect upon its release from the substrate.

To date, commercial MEMS sensor implementations rely on a "two-chip" approach where the MEMS structure is contained on a first chip while a control circuit is provided on another (e.g., an ASIC). For this approach, the MEMS structure is typically fabricated in bulk silicon substrate layers (e.g., an SOI layer), or surface micromachined into a polycrystalline semiconductor layer (e.g., silicon or SiGe). In general, for either of these techniques, the structural semiconductor material has very good mechanical properties with low intrinsic stress and also has a relative large thickness compared to thin films that are built-up upon the substrate through fabrication of CMOS circuitry, for example.

The two-chip approach however suffers from higher costs and larger form factors than would a single chip solution. Single-chip approaches have been hindered by the need to have the MEMS structures formed from low-stress bulk semiconductor films. Thin film structures capable of achieving high mass while remaining tolerant of intrinsic film stress would permit greater MEMS performance and permit further integration of MEMS with conventional integrated circuit technology, such as CMOS, facilitating a single-chip solution.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1A:
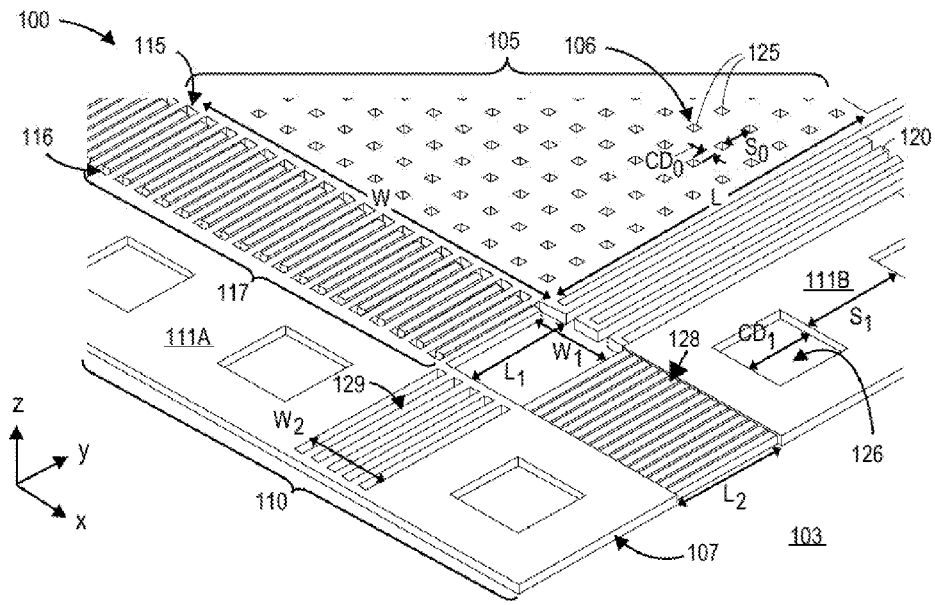
FIG. 1A is an isometric view of a metal stack including thin metal layers in a region of a MEMS, in accordance with an embodiment.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings and are not intended to restrict the application of claimed subject matter. Therefore, the following detailed description is not to be taken in a limiting sense and the scope of claimed subject matter is defined solely by the appended claims and their equivalents.

In the following description, numerous details are set forth, however, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" means that a particular feature, structure, function, or characteristic described in connection with the embodiment is included in at least one embodiment of the invention. Thus, the appearances of the phrase "in an embodiment" or "in one embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical, optical, or electrical contact with each other, and/or that the two or more elements co-operate or interact with each other (e.g., as in a cause an effect relationship).

The terms "over," "under," "between," and "on" as used herein refer to a relative position of one component or material layer with respect to other components or layers where such physical relationships are noteworthy. For example in the context of material layers, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similar distinctions are to be made in the context of component assemblies.

As used in throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

As described in greater detail below, a MEMS device, such as an accelerometer or gyroscope, is fabricated with interconnect metallization compatible with a CMOS microelectronic device. In embodiments, a proof mass has a first body region utilizing a thick metal layer that is separated from a thin metal layer. The thick metal layer has a film thickness that is significantly greater than that of the thin metal layer, advantageously increasing mass. The proof mass further includes a first sensing structure comprising the thin metal layer, but lacking the thick metal layer, enabling delineation of small feature sizes and spaces for an increase in coupling to a second sensing structure, that also comprises the thin metal layer and lacks the thick metal layer, formed in an adjacent frame. In further embodiments, both the proof mass and the flame are released from the substrate and the frame includes regions with the thick metal layer to better match film stress-induced static deflection of the proof mass. In certain such embodiments, regions of the frame lacking the thick metal are provided in alignment with thin metal features of the proof mass, and of a similar lateral dimension. Regions of thin metal frame may, for example, enable film stress in the frame to better match that in the proof mass. In certain such embodiments, mass increases in the frame associated with regions of thick metal are mitigated with larger dimensioned openings passing through the thin metal layer within the frame relative to those in the proof mass.

As further described in greater detail below, methods to fabricate MEMS devices with interconnect metallization thin films may include patterning a first body region of a proof mass in a metal film stack that includes a thick metal layer separated from a thin metal layer by dielectric layer. A second body region of a frame may be patterned at least one of the metal layers and advantageously the thick metal layer as well. At least the proof mass, and advantageously the frame as well, are then released from the substrate.

Generally, embodiments of MEMS structures described herein are suitable for a wide variety of MEMS devices. In exemplary embodiments, the MEMS device is a sensor of rotational velocity (i.e., a gyroscope), or linear acceleration (i.e., an accelerometer). For accelerometer embodiments, one or more of x-axis, y-axis and z-axis acceleration is sensed (with z-axis being perpendicular to a top surface of a substrate over which the MEMS is disposed). In embodiments, acceleration is sensed based on a measurable change in capacitance between two conductive sensing structures that are electrically insulated/isolated from each other but capacitively coupled. Other transduction means, such as, but not limited to inductive coupling structures, may also be utilized. For the exemplary capacitive embodiments described in detail herein, the change in capacitance is achieved through a change in capacitive plate area as a proof mass is displaced (either linearly or rotationally) relative to a frame in response to acceleration, rather than through a change in a distance between the capacitive members. The structures and techniques for imparting high mass with interconnect metal films while maintaining good tolerance to intrinsic film stress described herein may nonetheless be adapted to other MEMS structures that rely on a change in capacitor plate spacing.

In embodiments, a MEMS device includes thick and thin metal layers within a released member. Interconnect metallization employed in microelectronics fabrication generally comprises a plurality of metal thin films separated from each other by intervening interlayer dielectrics (ILD). Each metal layer of the metal film stack is significantly less than 1 μm, and typically no more than 0.5 μm. Advanced CMOS processes may have an interconnect metal stack that includes 4-9 levels of such metal layers (or more) with each layer being approximately the same thickness, or only slightly thicker (e.g., less than twice) as an underlying metal layer. In the exemplary embodiment, the interconnect metallization additionally includes a thick metal layer that is substantially thicker than any of the other metal layers. The thick metal layer for example may be at least 3 times thicker than the next thickest metal layer of the metal stack, advantageously at least 4 times thicker, more advantageously at least 5 times thicker, and may be 6-8 times thicker, or more. This thick metal layer may be employed, for example, as a power plane in CMOS circuitry and in embodiments herein the thick metal layer is further utilized in the MEMS structure to advantageously increase the mass of a released proof mass.

FIG. 1A is an isometric view of a thin metal stack 107 including one or more thin metal layers in regions of MEMS 100, in accordance with an embodiment. Both proof mass 105 and frame 110 are of a same thin metal stack 107. Where stack 107 includes more than one thin metal layer, each metal layer of the stack has substantially the same patterned features in vertical alignment with underlying layer(s) and overlying layers(s). The proof mass 105 includes a body region 106 and a sensing structure 115 connected to body region 106. Within body region 106, lower level openings 125 pass through at least one metal layer in thin metal stack 107. In the exemplary embodiment, openings 125 pass through all metal layers in thin metal stack 107 to expose an underlying substrate 103. Lower level openings 125 are arrayed over body region 106 and may be utilized for release of body region 106 from substrate 103 (i.e., "release holes"). Openings 125 have a first lateral critical dimension $CD_0$, which may vary with design rules of a process technology node. Openings 125 are further spaced apart by a lateral distance $S_0$ that may similarly satisfy one or more design rules (e.g., pattern density), and/or ensure proper release of proof mass 105 from substrate 103.

Sensing structure 115 includes a plurality of comb fingers extending outward from body region 106 by length $L_1$ along the width W. The comb fingers, also being of the metal stack 107 are patterned with fine geometries, advantageously with the smallest geometries permitted by design rules of the process technology node for each successive thin metal interconnect layer making up stack 107. For example, an individual comb finger may have a width CD less than 1 µm, while $L_1$ is tens of microns. A gap G separates sensing structure 115 from a second sensing structure 116 that is connected to frame 110 disposed over a second area of substrate 103. Gap G may be the smallest spacing (e.g., advantageously less than 0.5 µm) permitted by design rules of the process technology node for each successive thin metal interconnect layer making up stack 107. Sensing structure 116 includes another plurality of comb fingers extending outward from frame 110 by length $L_1$ along the width W. The comb fingers, also being of the metal stack 107, are patterned with fine geometries to interdigitate with those of sensing structure 115 forming interdigitated comb 117. A change in capacitance between sensing structures 115, 116 may be utilized to sense displacement of proof mass 105 relative to frame 110.

As further illustrated in FIG. 1A, proof mass 105 is physically coupled to frame 110 through spring 120 spanning a width $W_1$ between proof mass 105 and frame 110. Spring 120 is patterned in one or more thin metal layers (and intervening dielectrics) of metal film stack 107. The specific structure of spring 120 is highly dependent on the desired mechanical and electrical coupling/isolation between proof mass 105 and frame 110 and embodiments herein are not limited to any specific spring architecture.

Frame 110 further includes a body region 111A, adjacent to a first side of the proof mass 105 of width W, joined to a second body region 111B that adjacent to a second side of the proof mass 105 of length L. Second lower level openings 126 pass through at least one metal layer within the body regions 111A, 111B. Each opening 126 has a second lateral dimension $CD_1$ and is spaced apart from a nearest neighboring opening by a lateral distance $S_1$. In the exemplary embodiment where frame 110 is (partially) released from substrate 103, openings 126 may also function as release holes, however both $CD_1$ and $S_1$ are significantly greater than $CD_0$ and $S_0$, respectively. Larger dimensioned openings 126 advantageously reduce the mass of frame 110, and, along with spacing $S_1$, may further tune deflection of frame 110 relative to proof mass 105.

In exemplary embodiments, a frame further includes extension structures. In FIG. 1, frame 110 includes a comb extension structure 128 and a spring extension structure 129. Comb extension structure 128 includes fingers passing through the lateral width of frame body region 111B that are of a similar lateral dimensions as that of interdigitated combs 117 (e.g. $L_2=L_1$, finger width, and gap spacing is substantially the same). Fingers in comb extension structure are not cantilevered beams, but instead are anchored at opposite ends to frame body regions. Comb extension structure 128 is further in lateral alignment (e.g., in y-dimension) with interdigitated combs 117. Likewise, spring extension structure 129 includes fingers passing through the lateral width of frame body region 111A that has similar lateral dimensions to spring 120 (e.g., $W_2=W_2$). Spring extension structure 129 is further in lateral alignment (e.g., in x-dimension) with spring 120. Noting extension structures 128, 129 lack a direct coupling function akin to that of interdigitated combs 117 or spring 120, incorporation of these structures is advantageous for matching film stress in frame 110 with that in proof mass 105. This is particularly advantageous where frame 110 is released front substrate 103 in a manner that renders frame body 111B susceptible to static deflection to or from substrate 103, as described further elsewhere herein. Extension structures 128, 129 increase structural similarity between frame 110 and proof mass 105 that helps to match static deflection of frame 110 to that of proof mass 105.

Figure 1B:
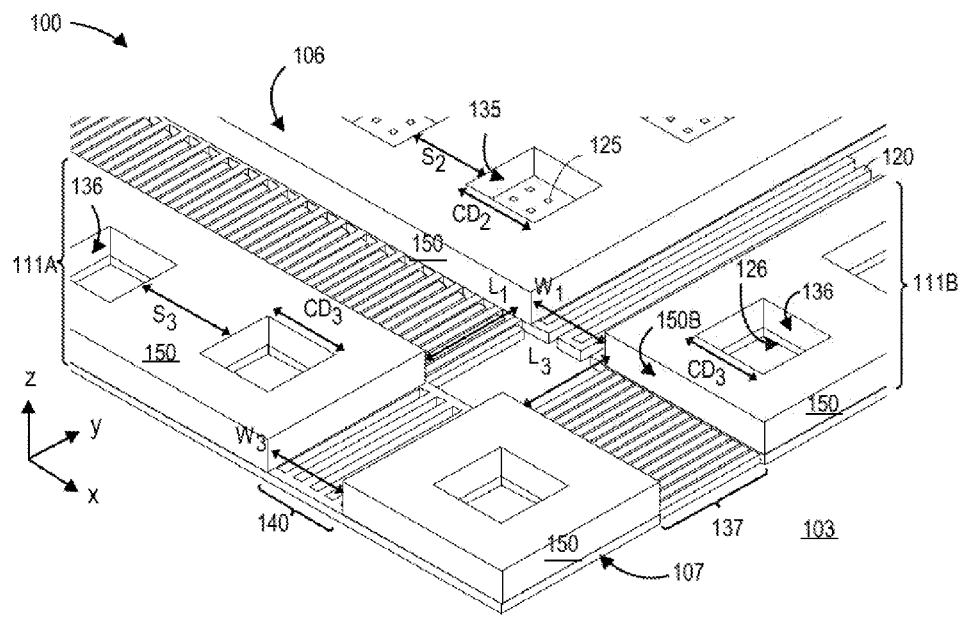
FIG. 1B is an isometric view of a metal stack including a thick metal layer in certain portions of the MEMS region in FIG. 1A, in accordance with an embodiment.

In embodiments, a thick metal layer is disposed over a thin metal layer in only certain portions of the MEMS. FIG. 1B is an isometric view of a thick metal layer 150 disposed over thin metal stack 107 in certain regions of the MEMS 100. In general, metal stack 107 is covered with thick metal layer 150 within proof mass body region 106 as well as frame body regions 111A, 111B. Thick metal layer 150 may be at least 3 times thicker than any thin metal layer of metal stack 107, advantageous at least 4 times thicker, more advantageously at least 5 times thicker, and may be 6-8 times thicker, or more. Thick metal layer 150 is patterned such that certain regions of MEMS 100 have only thin metal layers. As shown in FIG. 1B, thick metal 150 is absent from sensing structures 115, 116, and is also absent from spring 120. Because of greater thickness, thick metal 150 may be patterned with insufficient fidelity to achieve advantageously high surface area and small gap spacing between sensing structures 115, 116. Similarly, thick metal pattern fidelity may be insufficient to achieve a desired mechanical coupling in spring 120. Nevertheless, body region 106 includes thick metal 150, which may increase mass significantly above that of metal stack 107 alone.

Within body region 106, openings 135 pass through thick metal layer 150. In the exemplary embodiment, large openings 135 are distributed (e.g., in a two dimensional array) over proof mass body region 106. Each large opening 135 has a critical lateral dimension $CD_2$ and adjacent large openings 135 are spaced apart by a lateral distance $S_2$. In embodiments, $CD_2$, is significantly larger than gap G. In further embodiments, $CD_2$ is also significantly larger than the lateral dimension $CD_0$ and advantageously larger than $CD_0+S_0$ such that more than one lower level opening 125 is disposed within a single opening 135, as depicted in FIG. 1B. In certain such embodiments, $S_2$ is also significantly larger than gap G, and larger than distance $S_1$. Lateral dimension $CD_2$ and spacing $S_2$ may, for example, be set to minimum feature pitch and/or pattern density design rules for thick metal layer 150.

Large openings 136 are similarly distributed (e.g., linearly arrayed) over frame body regions 111A, 111B. Each large opening 136 has a critical lateral dimension $CD_3$ and adjacent large openings 136 are spaced apart by a lateral distance $S_3$. In embodiments, $CD_3$ is approximately equal $CD_2$ as guided by the same design rule. Similarly, in the exemplary embodiments $S_3$ is equal to $S_2$. With stress in frame 110 being a strong function of film stress in thick metal 150, dimensioning and spacing openings 136 in a manner that is similar to openings 135 advantageously matches deflection in frame 110 to that of proof mass 105. In certain such embodiments, the lateral spacing $S_1$ of lower level openings 126 is approximately equal to $S_3$ and lateral dimension $CD_1$ of opening 126 is at least approximately equal to $CD_3$ such that opening 126 is approximately the same size as opening 136, ensuring a large reduction in mass of frame 110.

In embodiments, a frame includes thin metal regions disposed in lateral alignment with thin metal regions present in structures that couple the fame to the proof mass (e.g., electrical coupling through a sensing structure and mechanical coupling through a spring structure). In further embodiments, a thin metal flame region has a same lateral dimension as a thin metal region of the coupling structure to which it is aligned. In the exemplary embodiment illustrated in FIG. 1B, thin metal frame region 137 is disposed along frame body region 111A in lateral alignment with interdigitated comb 117 such that thick metal sidewall 150B is coincident with comb extension 128. Because thick metal layer 150 is absent over comb extension structure 128, thin metal flame region 137 has approximately the same lateral dimension (e.g., in y-dimension) as extension structure 128 and interdigitated combs 117 (i.e., $L_1=L_2=L_3$). Similarly, thin metal frame region 140 is laterally aligned (e.g. in x-dimension) with spring 120 and has approximately the same lateral dimension (e.g., in x-dimension) as spring extension structure 129 and the span of spring 120 (i.e., $W_1=W_2=W_3$). As with the extension regions, the thin metal frame regions are advantageous for matching film stress in frame 110 with that in proof mass 105. Thin metal frame regions 137, 140 are independent of extension structures 128, 129 such that a thin metal frame region need not also be patterned into an extension structure, and a patterned extension structure need not be flee of the thick metal layer. The exemplary thin metal extension region however is particularly advantageous where frame 110 is released from substrate 103 in a manner that permits static deflection of flame body 111B to or from substrate 103 because static deflection of proof mass 105 may be well-matched to that of a frame 110 having thin metal frame regions 137, 140 patterned into extension structures 128, 129.

Figure 2:
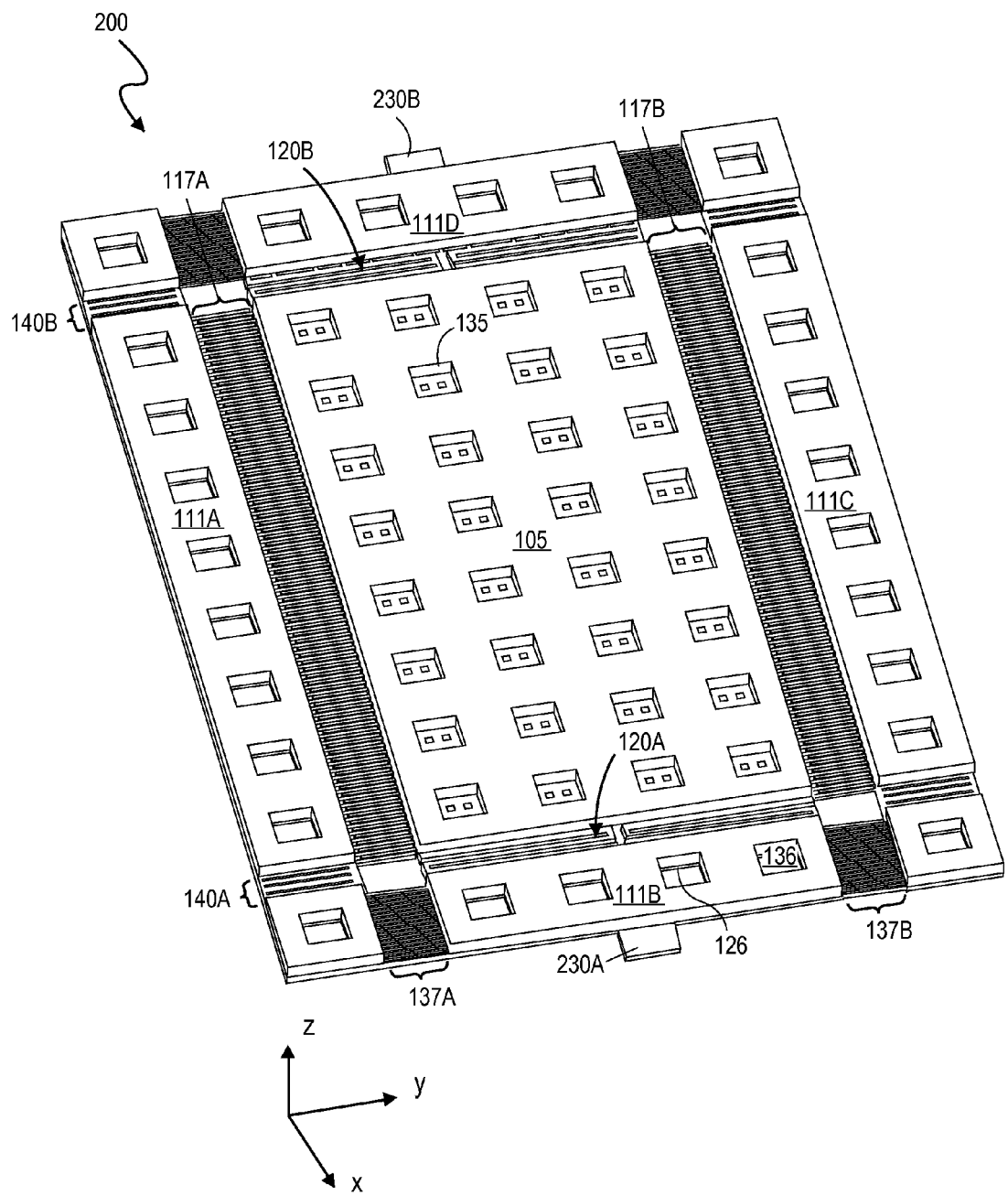
FIG. 2 is an isometric view of a MEMS employing the structures illustrated in FIG. 1B, in accordance with an embodiment.

FIG. 2 is an isometric view of MEMS 200, in accordance with one accelerometer embodiment employing the MEMS structures described in the context of FIG. 1B. As shown, frame 110 entirely surrounds proof mass 105. Thick metal layer 150 is patterned with large openings 136 in frame body regions 111A, 111B, 111C, 111D to match lateral dimensions and lateral spacing of openings 135 in proof mass 105. Thin metal frame regions 140A and 140B stripe opposite ends of interdigitated combs 117A, 117B on first opposing sides of proof mass 105. Similarly, thin metal frame regions 137A and 137B snipe opposite ends of springs 120A, 120B on a second opposing sides proof mass 105. Two opposing frame body regions 111B, 111D are anchored to substrate 103 at anchor points 230A, 230B with the remainder of frame 110 released from substrate 103 to suspend from the anchor points 230A, 230B along with poof mass 105. The mass differential between proof mass 105 and frame 110 therefore stems from the differential in substrate area occupied by proof mass 105 and frame 110, as well as the differential in size of lower level openings 125 and 126.

Figure 3A:
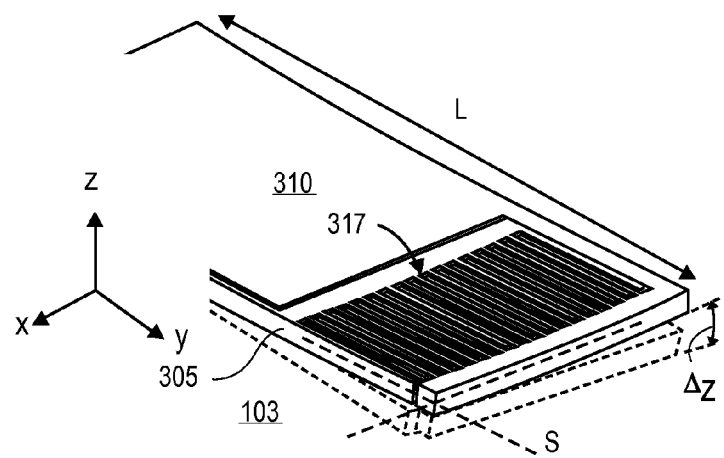
FIG. 3A is an isometric view of a released MEMS proof mass and released frame having approximately equal static deflection from a substrate, in accordance with an embodiment.

In embodiments where both a proof mass and a frame are released, the frame and proof mass have approximately the same static deflection relative to an underlying substrate. FIG. 3A is an isometric view of a released MEMS proof mass and released frame having approximately equal static deflection from a substrate 103, in accordance with an embodiment. The dashed line represents position of the proof mass 305 and frame 310 at a time prior to release from substrate 103 and the solid line drawing depicts position of proof mass 305 and frame 310 at a time following release from substrate 103. As shown, the free ends of proof mass 305 and frame 310 statically deflect from a plane of substrate 103 by an amount $\Delta z$ that is not uniform (e.g., varying from 0.1 μm-1 μm). For best sensing by interdigitated combs 317, proof mass 305 and frame 310 should have nearly identical curvature along any cantilevered lateral lengths to be follow substantially a same surface S. For such embodiments, the extension structures and thin metal regions previously described advantageously permit stress matching between the frame and proof mass to achieve the nearly identical static deflection curvature that properly positions the sensing structures.

Figure 3B:
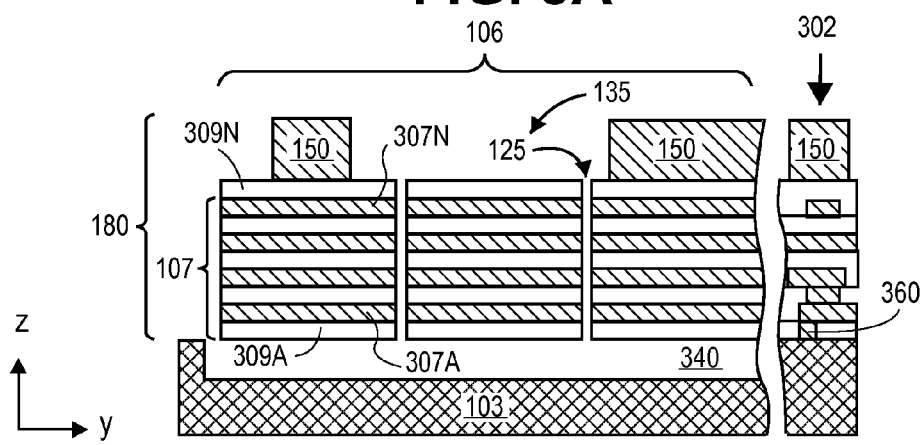
FIG. 3B is a cross-sectional view of a MEMS proof mass employing a thick metal layer, in accordance with an embodiment.

In embodiments, a MEMS gyroscope or accelerometer includes a released proof mass electrically coupled to CMOS circuitry formed on the same substrate as the MEMS gyroscope or accelerometer. In the exemplary embodiment, the MEMS gyroscope or accelerometer includes a released proof mass and/or frame comprising the same thin film metal interconnect layers present in the CMOS circuitry. FIG. 3B is a cross-sectional view of a MEMS proof mass employing a thick metal layer, in accordance with an embodiment. FIG. 3B further illustrates one embodiment applicable to the MEMS structures depicted in FIGS. 1A-1B. In the exemplary embodiment, thick metal 150 is a top, capping layer of metal film stack 180. Thick metal layer 150 is disposed over a plurality of thin metal layers 307A-307N that make up thin metal stack 107. Dielectric layers 309A-309N separate each thin metal layer 307A-307N, and further separate thick metal layer 150 from a topmost thin metal layer 309N. FIG. 3B illustrates both a portion of proof mass body region 106 and a CMOS region 302. Within proof mass body legion 106, large opening 135 exposes a plurality of lower level openings 125. Each opening 125 passes through each thin metal layer 307A-307N, as well as through intervening dielectric layers 309A-309N, to expose substrate 103. In embodiments, at least one of the substrate or a dielectric layer between a thin metal layer and the substrate is removed to release the proof mass. In the exemplary embodiment depicted in FIG. 3B, thin metal stack 107 is released as a result of recess 340 having been etched into a portion of substrate 103. CMOS region 302 is adjacent to a MEMS employing proof mass body region 106, CMOS circuitry including a plurality of MOS transistors 360 is interconnected with layers of thin metal stack 107 disposed within CMOS area 302. CMOS area 302 may further include thick metal layer 105, for example as a power plane for the CMOS circuitry.

Figure 3C:
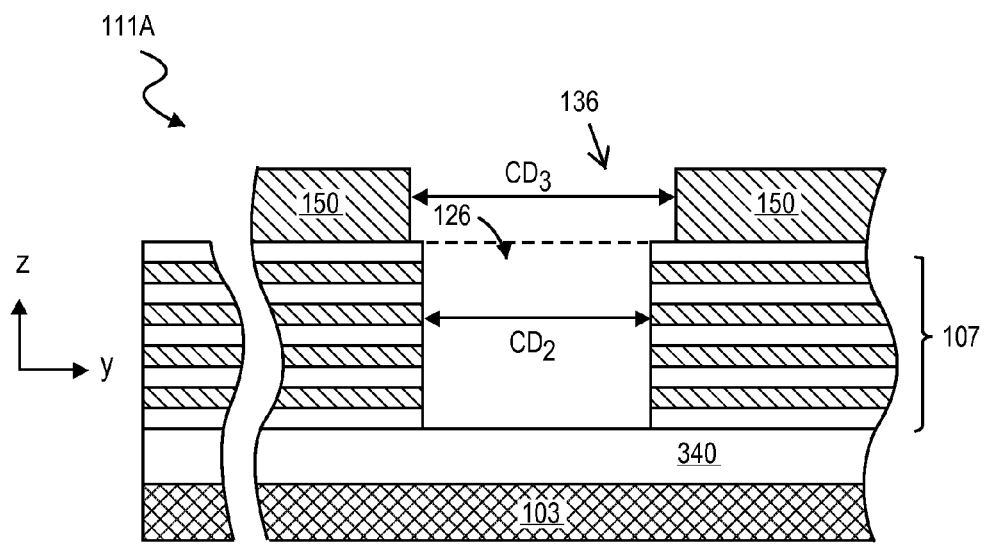
FIG. 3C is a cross-sectional view of a MEMS frame employing a thick metal layer, in accordance with an embodiment.

FIG. 3C is a cross-sectional view of a frame body region 111A employing thick metal layer 150, in accordance with an embodiment. FIG. 3C illustrates one exemplary embodiment where thick metal layer 150 is a capping layer over thin metal film stack 107, just as for proof mass body 106 depicted FIG. 3B. Large opening 136 is vertically aligned with lower level opening 126. Lower level opening 126 extends through all thin metal layers of thin metal stack 107, and exposes substrate 103. In advantageous embodiments $CD_3$ is substantially equal to $CD_2$.

Figure 4:
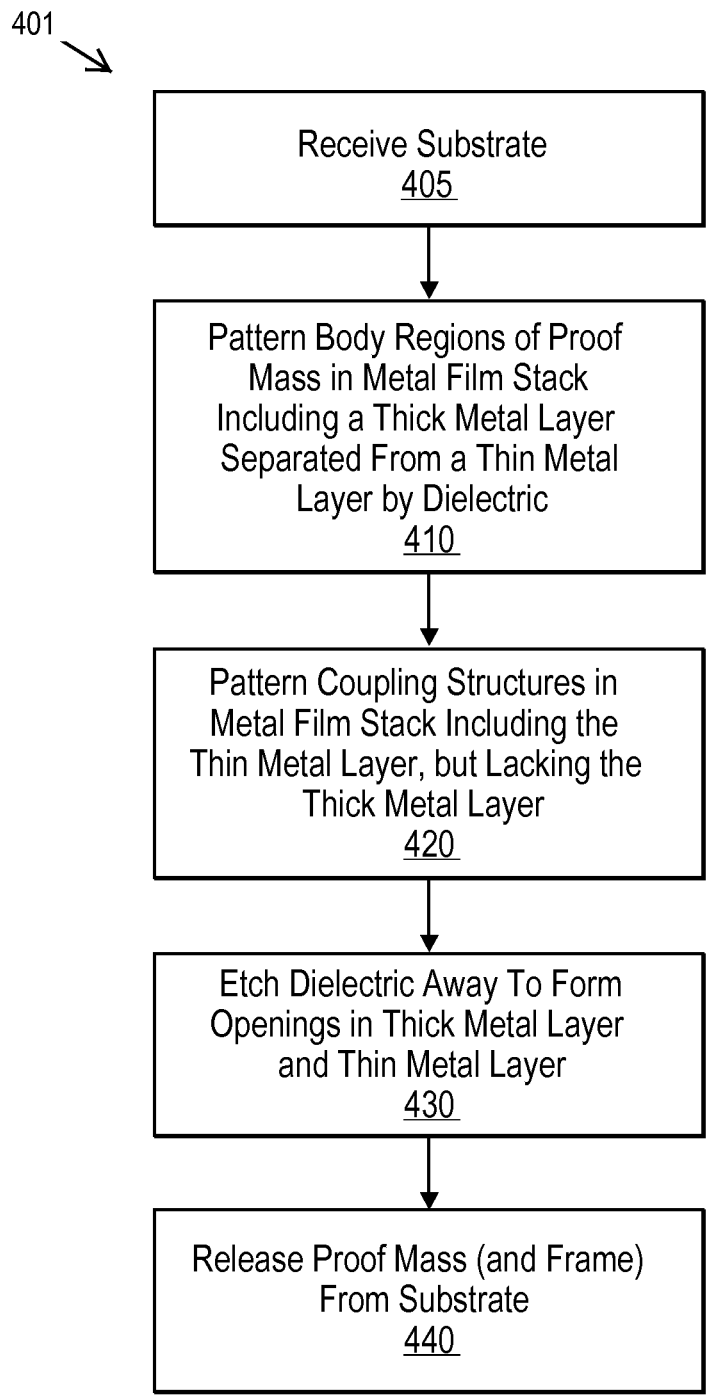
FIG. 4 is a flow diagram illustrating methods of fabricating a MEMS with a thick metal layer, in accordance with an embodiment.
Figure 5A:
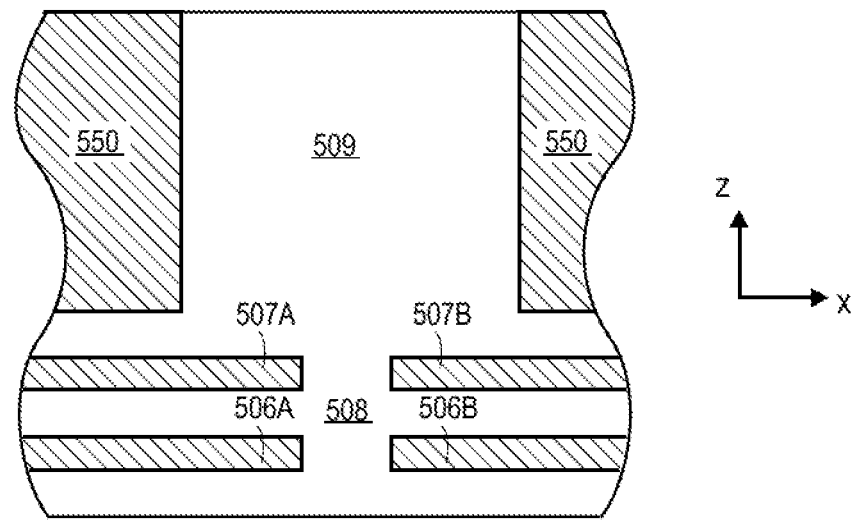
FIG. 5A is cross-sectional view showing a proof mass employing a thick metal layer in a metal film stack, in accordance with an embodiment.
Figure 5B:
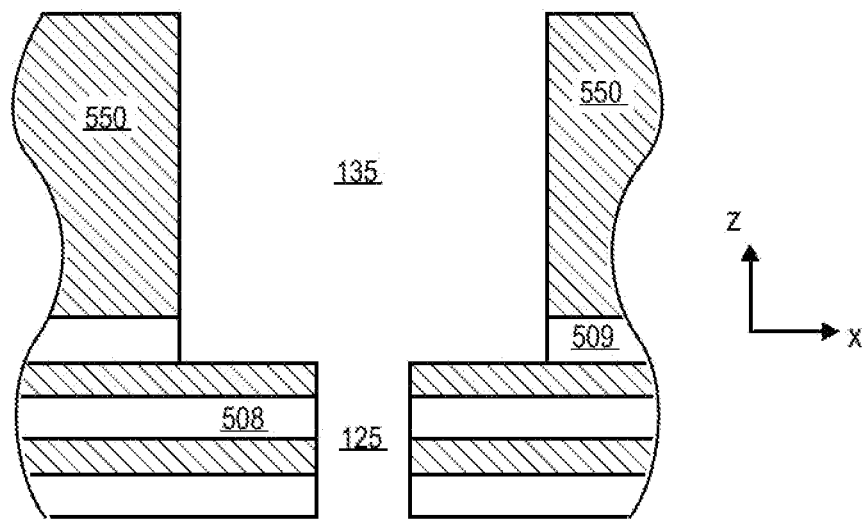
FIG. 5B is cross-sectional view showing a release of a proof mass employing a thick metal layer, in accordance with an embodiment.

FIG. 4 is a flow diagram illustrating a method 401 of fabricating a MEMS sensor with a thick interconnect metal layer, in accordance with an embodiment. Method 401 begins with receiving a substrate at operation 405. The substrate may be any semiconductor (e.g., silicon), semiconductor-on-insulator (SOI), other conventional material. In one exemplary embodiment, the substrate is silicon and includes MOS transistors. At operation 410, body regions of a proof mass and frame are patterned into a metal film stack that includes a thick metal layer separated from a thin metal layer by a dielectric. In embodiments, the patterning operation 410 is performed concurrently with patterning of the metal film stack into interconnects for the MOS transistors to form CMOS circuitry. Patterning of the metal layers may proceed by conventional damascene processing as is typically performed in CMOS technology. For example, openings are formed through a dielectric layer, and a fill metal, such as copper, plated up in the dielectric openings. Where the metal film stack includes a plurality of thin metal layers, patterning operation 410 may be an iterative process with patterning of essentially the same feature in each of a plurality of thin metal layers. Features formed in the metal layers may be vertically aligned across successive metal layers, for example as is depicted in FIG. 5A illustrating a structure in a proof mass body region following operation 410. As shown, two thin metal layers are patterned to have vertically aligned features 506A, 507A laterally separated from vertically aligned features 506B, 507B with dielectric 508 disposed there between. Patterning of the thick metal layer proceeds in a similar manner upon completing the thin metal film stack. In FIG. 5A, thick metal layer 550 is patterned to have dielectric 509 vertically aligned with dielectric 508. At operation 420, coupling structures (e.g., sensing structures and springs, etc.) are patterned into a metal film stack that includes a thin metal layer, but lacks the thick metal layer. In embodiments, patterning operation 420 is performed concurrently with patterning operation 410 with dielectric layer patterning and metal fill proceeding as for the body regions except no top level openings are formed to receive a thick metal fill over the coupling structures and extension structures. At operation 430, exposed dielectric is etched selectively to the metal layers to form openings in the thick metal vertically aligned with openings in the underlying thin metal layers. Openings in the underlying layers are further formed by continuing the etch process to remove any dielectric exposed between vertically aligned thin metal features. These openings may serve as release holes, or solely for weight relief and/or tuning of a features static deflection. In embodiments, the openings in the thick metal layer have a lateral CD at least three times larger than a lateral CD of an underlying opening patterned in the thin metal layers. FIG. 5B is a cross-sectional view of the structure that was depicted in FIG. 5A subsequent to operation 430, in accordance with an embodiment. As shown, removal of dielectric 509 results in opening 135 that exposes thin metal features 507A, 507B. The etch at operation 430 further removes dielectric 508 selectively to metal features 507A, 507B to form lower level opening 125 that passes vertically through the plurality of thin metal layers. Because the metal layers are separated by dielectric, the etch operation 430 is advantageously anisotropic so as to avoid undercutting individual metal layers during formation of opening 125. In the exemplary embodiment, the etch is a plasma etch process capable of high aspect ratio (HAR) etching. In regions where no thick metal is present, for example over coupling structures, dielectric etching at operation 430 also opens the gap G between comb fingers and lengths of coupling springs. Method 401 completes at operation 440 with any additional etching needed to fully release the proof mass and frame from the substrate. For example, an isotropic wet chemical, vapor phase, or plasma etch may be performed to selectively remove a sacrificial material, such as substrate semiconductor, to form the substrate void depicted in FIGS. 2B, 2C.

Figure 6A:
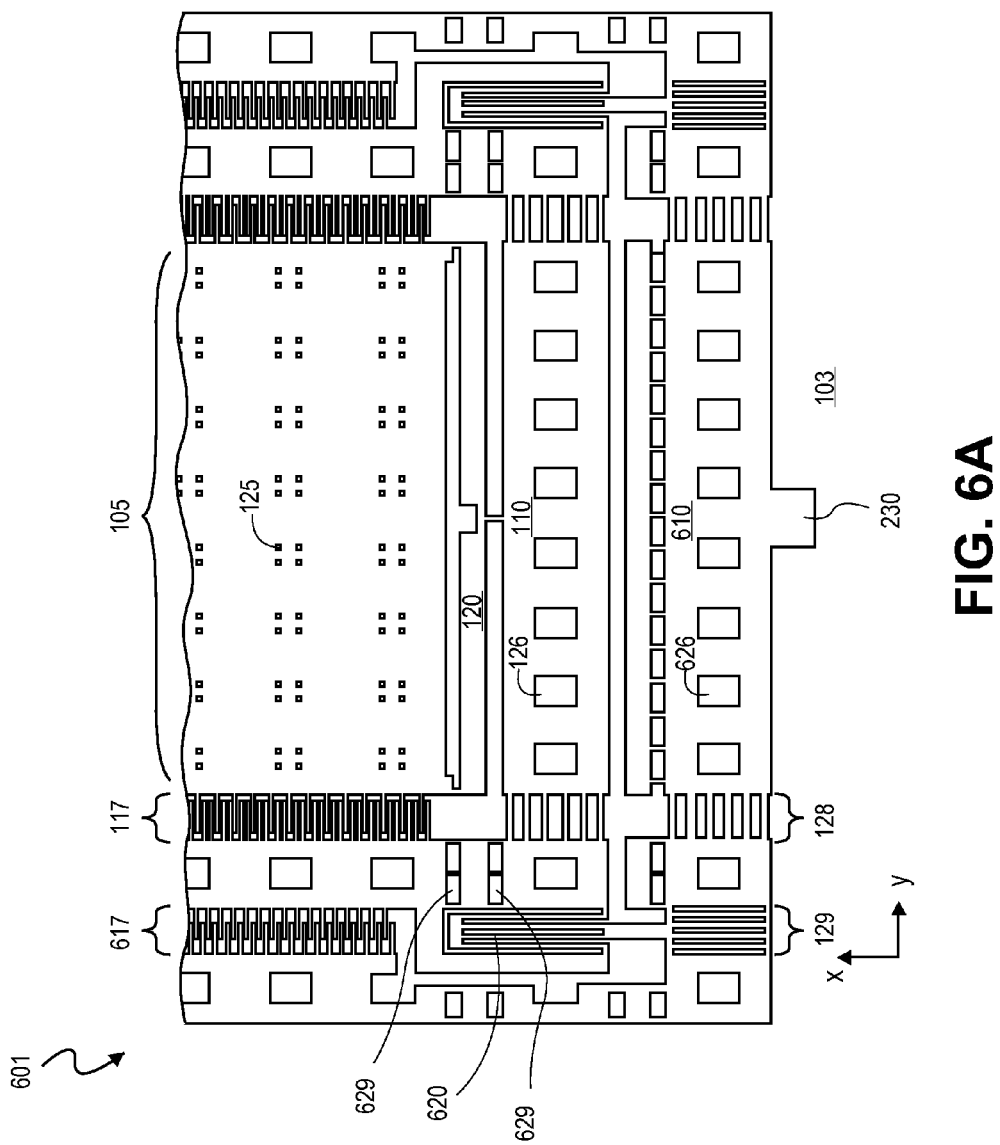
FIG. 6A is a plan view of a MEMS device employing a thick metal layer, in accordance with another embodiment.
Figure 6B:
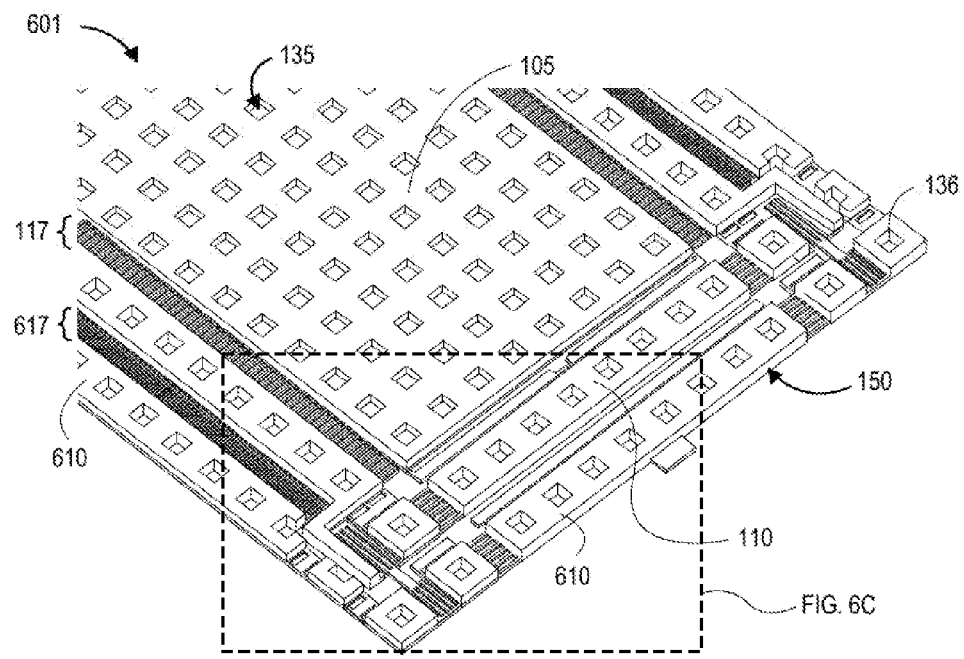
FIGS. 6B and 6C are isometric views of the MEMS device depicted in FIG. 6A.
Figure 6C:
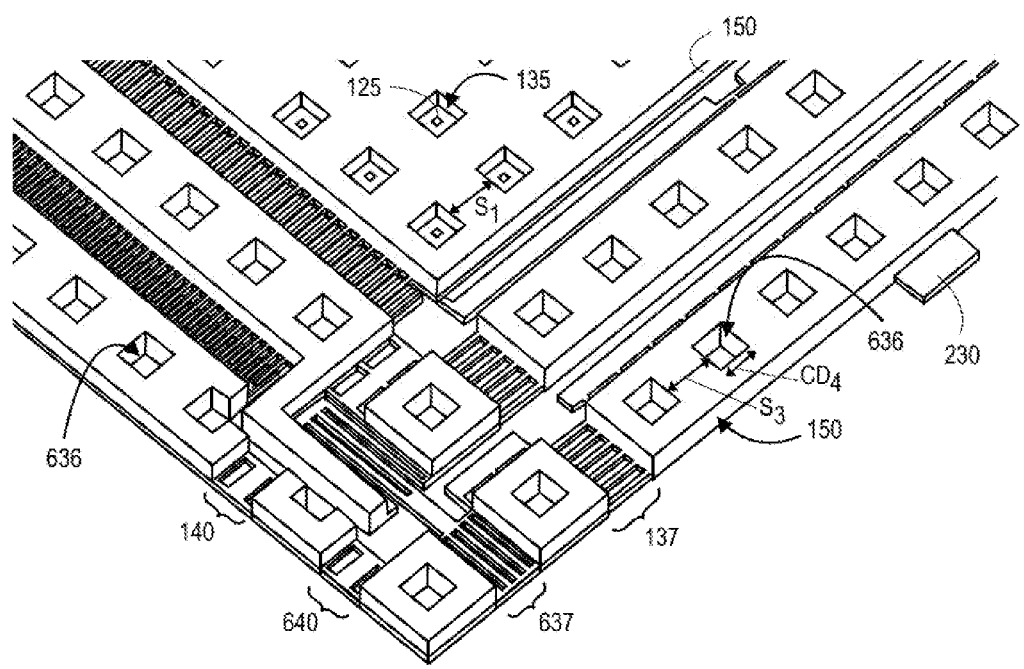

FIGS. 6A-6C are views of a MEMS gyroscope 601 employing a thick metal layer, in accordance with another embodiment. The gyroscope 601 has a number of additional design attributes relative to MEMS 200 described elsewhere herein to emphasize the breadth of the architectures and techniques recited in the claims. FIG. 6A is a partial plan view of features formed in a thin metal layer (or stack of multiple such layers). As shown, gyroscope 601 again includes a plurality of lower-level openings 125 arrayed over a body region proof mass 105. Proof mass 105 is mechanically coupled to frame 110 through spring 120. Proof mass 105 is electrically coupled to frame 110 through a sensing structure comprising interdigitated combs 117, as previously described. Frame 110 has openings 126 spaced apart a distance $S_2$. Frame 110 is mechanically coupled to an outer frame 610 through spring 620. Outer frame 610 includes openings 626 having lateral dimensions and spacing equal to that of openings 126. Outer frame 610 is further mechanically coupled to substrate 103 by anchor point 230 and electrically coupled to frame 110 by a second sensing structure comprising interdigitated combs 617. Both frames 110 and 610 include patterned comb extension structures 128 and spring extension structures 129, 629, which may improve matching of film stresses in frames 110 and 610 and in proof mass 105. This is particularly advantageous in the exemplary embodiment where frames 110 and 610 are released from substrate 103. As further shown in FIG. 6A, spring 620 and spring extension structure 129 are confined to a lateral CD approximately equal to that of interdigitated comb 617, for example to further match film stresses in frames 110 and 610 and proof mass 105.

FIGS. 6B and 6C are isometric views of the MEMS device 601 further illustrating thick metal layer 150 disposed over regions of the thin metal layer. As shown, proof mass body region includes a plurality of large openings 135 in thick metal layer 150. Each large opening exposes four of the lower level openings 125. Frames 110 and 610 further include a plurality of large openings 136 and 636, respectively. Openings 636 have a lateral dimension that is substantially equal to that of opening 136 (e.g., $CD_3=CD_4$). Openings 136 and 636 are vertically aligned with openings 126, 626, respectively. Both frames 110 and 610 further include thin metal frame regions 137, 637, 140, and 640, for example to match film stresses in frames 110 and 610 and proof mass 105.

Figure 7:
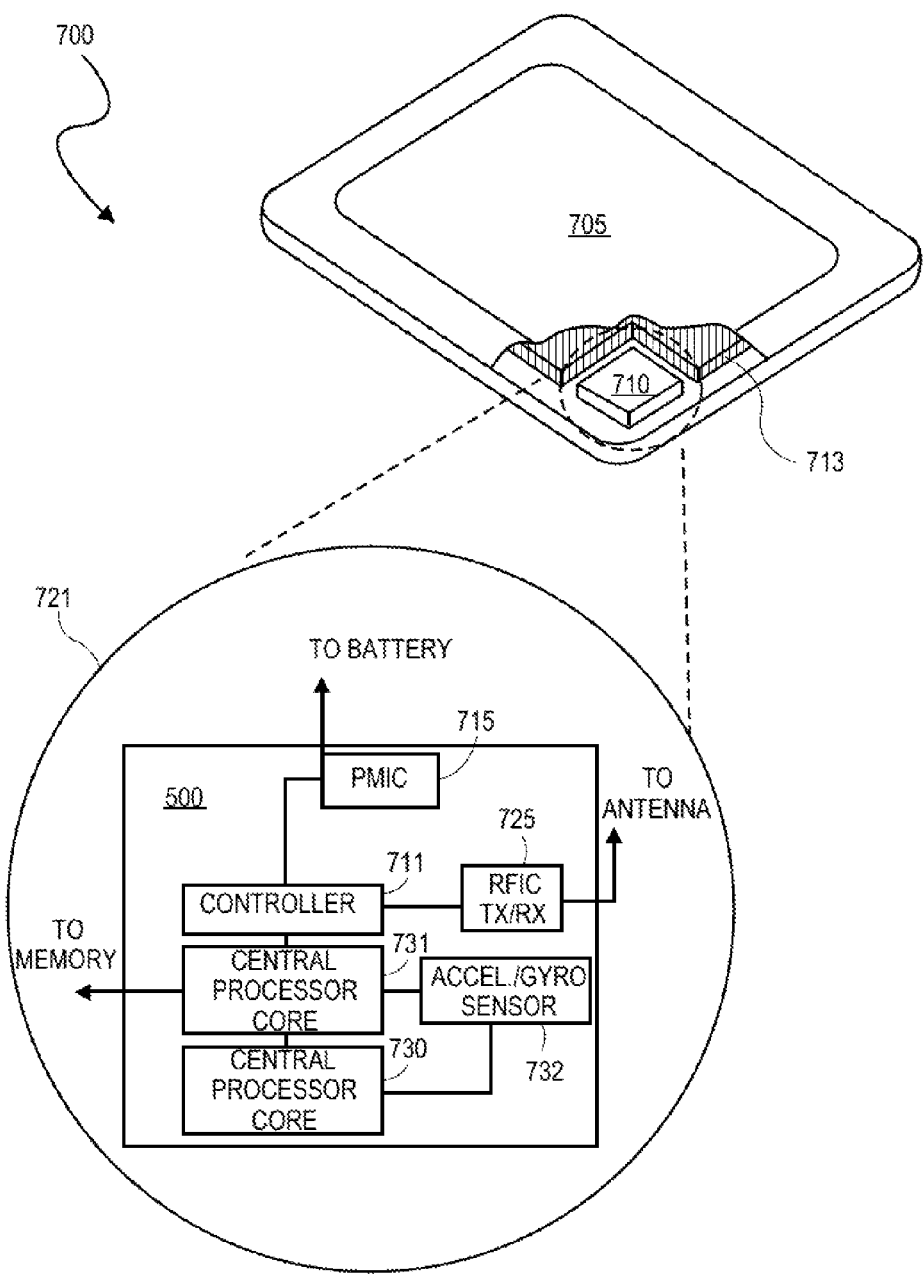
FIG. 7 illustrates isometric and expanded views of a mobile computing platform including a MEMS, in accordance with an embodiment.

FIG. 7 illustrates an isometric view of a computing device platform 700 and schematic view 721 of a microelectronic device 710 employed by the platform, in accordance with an embodiment of the present invention. The computing platform 700 may be any portable device configured for each of electronic data display, electronic data processing and wireless electronic data transmission. For exemplary mobile embodiments, the computing platform 700 may be any of a tablet, a smart phone, laptop or ultrabook computer, etc., further including a display screen 705 that may be a touchscreen (capacitive, inductive, resistive, etc.), a chip-level (SoC) or package-level integrated microelectronic device 710, and a battery 713. The integrated device 710 is further illustrated in the expanded view 721. In the exemplary embodiment, the device 710 includes at least one memory chip and at least one processor chip (e.g., a multi-core microprocessor and/or graphics processor cores 730, 731). In embodiments, an integrated MEMS accelerometer or gyroscope 732 employing a thick metal layer, for example as described in more detail elsewhere herein (e.g., FIGS. 1A, 1B, etc.), is integrated into the device 710. The device 710 is further coupled to the board, substrate, or interposer 500 along with, one or more of a power management integrated circuit (PMIC) 715, RF (wireless) integrated circuit (RFIC) 725 including a wideband RF (wireless) transmitter and/or receiver (e.g., including a digital baseband and an analog front end module further comprising a power amplifier on a transmit path and a low noise amplifier on a receive path), and a controller thereof 711. Functionally, the PMIC 715 performs battery power regulation, DC-to-DC conversion, etc., and so has an input coupled to the battery 713 and with an output providing a current supply to all the other functional modules, including the MEMS 732.

As further illustrated, in the exemplary embodiment the RFIC 725 has an output coupled to an antenna to provide to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. In implementations, each of these modules, including the MEMS structure and CMOS circuitry, may be integrated onto a single chip as an SoC, onto separate ICs coupled to a package substrate of the packaged device 710, or at a board level.

Figure 8:
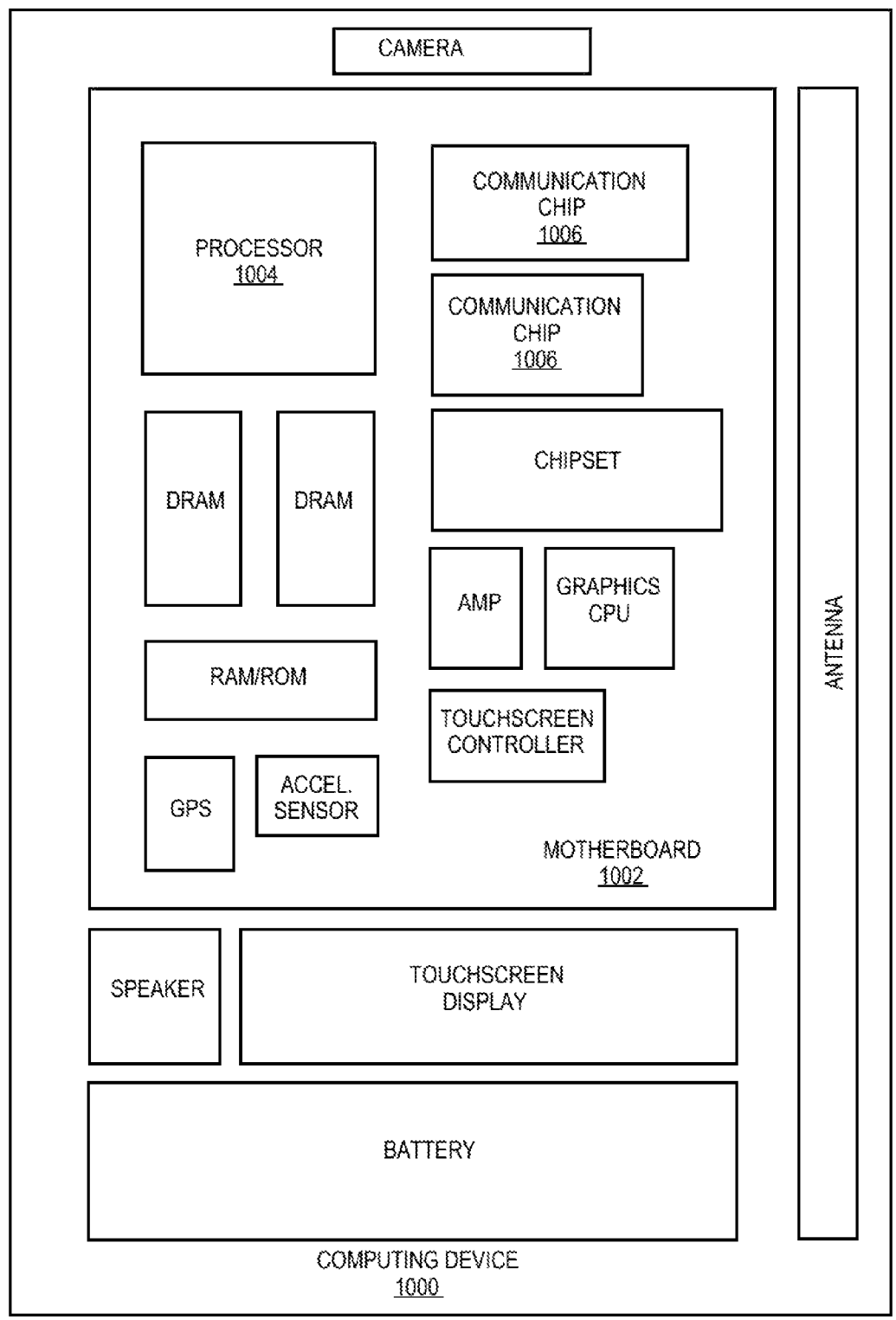
FIG. 8 illustrates a computing device in accordance with one implementation of the invention.

FIG. 8 is a functional block diagram of a computing device 1000 in accordance with one embodiment of the invention. The computing device 1000 may be found inside the platform 700, for example, and further includes a board 1002 hosting a number of components, such as but not limited to a processor 1004 (e.g., an applications processor) and at least one communication chip 1006. In embodiments, at least the processor 1004 is integrated (e.g., in-package) with a MEMS accelerometer and/or gyroscope in accordance with embodiments described elsewhere herein. The processor 1004 is physically and electrically coupled to the board 1002. The processor 1004 includes an integrated circuit die packaged within the processor where the tem "processor" may refer to any device or portion of a device that processes electronic data from registers and/or memory to transform that electronic data into other electronic data that may be stored in registers and/or memory.

In some implementations the at least one communication chip 1006 is also physically and electrically coupled to the board 1002. In further implementations, the communication chip 1006 is part of the processor 1004. Depending on its applications, computing device 1000 may include other components that may or may not be physically and electrically coupled to the board 1002. These other components include, but are not limited to, volatile memory (e.g., DRAM), non-volatile memory (e.g., RAM or ROM) in the form of flash memory or STTM, etc., a graphics processor, a digital signal processor, a crypto processor, a chipset, an antenna, touchscreen display, touchscreen controller, battery, audio codec, video codec, power amplifier, global positioning system (GPS) device, integrated inertial sensor, accelerometer, speaker, camera, and mass storage device (such as hard disk drive, solid state drive (SSD), compact disk (CD), digital versatile disk (DVD), and so forth). At least one of the communication chips 1006 enables wireless communications for the transfer of data to and from the computing device 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The commination chip 1006 may implement any of a number of wireless standards or protocols, including but not limited to those described elsewhere herein. The computing device 1000 may include a plurality of communication chips 1006. For instance, a first communication chip 1006 may be dedicated to shorter-range wireless communications such as Wi-Fi and Bluetooth and a second communication chip 1006 may be dedicated to longer-range wireless communications such as GPS, EDGE, GPRS, CDMA, WiMAX, LTE, Ev-DO, and others.

It will be recognized that the invention is not limited to the embodiments so described, but can be practiced with modification and alteration without departing from the scope of the appended claims. For example, the above embodiments may include specific combination of features.

In one exemplary embodiment, a Microelectromechanical System (MEMS), comprises a substrate, a released proof mass disposed over a first area of the substrate and having a first body region. The first body region may further comprise a thick metal layer over a thin metal layer, the thick metal layer having a film thickness that is at least five times greater than that of the thin metal layer, and a first sensing structure comprising the thin metal layer, but lacking the thick metal layer. The MEMS may further include a frame disposed over a second area of the substrate, the frame having, a second body region comprising at least one of the metal layers, and a second sensing structure comprising the thin metal layer, but also lacking the thick metal layer, and separated from the first sensing structure by a gap to register a change in capacitance with displacement of the proof mass relative to the frame.

In a further embodiment, the second body region comprises the thin metal layer and the thick metal layer. The frame is at least partially released from the substrate, and the first and second body regions are both statically deflected from a surface of the substrate.

In a further embodiment, the second body region comprises the thin metal layer and thick metal layer. The first body region further comprises a first plurality of large openings distributed over the first body region, each of the first large openings extending through the thick metal layer, having a first lateral dimension that is larger than the gap, and spaced apart by a first spacing. The second body region further comprises a second plurality of the large openings distributed over the second area of the substrate, each of the second plurality of large openings extending through the thick metal layer, and spaced apart by the first spacing. In a further embodiment, the second body region comprises the metal film stack, including the thick metal layer. The first body region further comprises a first plurality of large openings distributed along a first dimension of the substrate, each of the first large openings extending through the thick metal layer, having a first lateral dimension that is larger than the gap, and spaced apart by a first spacing. The second body region further comprises a second plurality of the large openings distributed along the first dimension, each of the second large openings extending through the thick metal layer, and spaced apart by the first spacing. At least one of the first large openings exposes a first lower level opening that extends through at least the thin metal layer and exposes the substrate. The first lower level opening has a second lateral dimension smaller than the first lateral dimension. At least one of the second large openings exposes a second lower level opening that extends through at least the thin metal layer and exposes the substrate. The first lower level opening has a third lateral dimension larger than the second lateral dimension.

In a further embodiment, the second body region comprises the metal film stack, including the thick metal layer. The first body region further comprises a first plurality of large openings distributed over the first substrate area, each of the first large openings extending through the thick metal layer, having a first lateral dimension, and spaced apart by a first spacing that is larger than the gap. At least one of the first large openings exposes a plurality of first lower level opening that extend through a plurality of underlying thin metal layers in the stack and expose the substrate. The second body region further comprises a second plurality of the large openings distributed across the second substrate area, each of the second large openings extending through the thick metal layer and spaced apart by the first spacing. One of the second large openings exposes only a single second lower level opening that extends through a plurality of underlying thin metal layers in the stack and exposes the substrate.

In a further embodiment, the frame has a first frame side adjacent to a length of the proof mass, and has a second frame side adjacent to a width of the proof mass, and orthogonal to the first frame side. The first sensing structure comprises a first plurality of comb fingers extending from the first body region toward the first frame side and distributed along the length. The second sensing structure comprises a second plurality of comb fingers along the first side, extending from the second body region toward the proof mass, and interdigitated with the first plurality of fingers. The frame comprises thick metal frame regions including the thick metal layer, and thin metal flame regions lacking the thick metal layer. A first of the thin metal frame regions is disposed along the second frame side in alignment with the first and second fingers and has a thickness and a lateral dimension approximately equal to that of the first and second comb fingers.

In a further embodiment, the frame has a first flame side adjacent to a length of the proof mass, and has a second frame side adjacent to a width of the proof mass. The proof mass is physically coupled to the frame through a spring spanning a distance between the proof mass to the first flame side. The spring comprises at least the thin metal layer, but lacks the thick metal layer. The frame comprises thick metal frame regions including the thick metal layer, and thin metal frame regions lacking the thick metal layer A first of the thin metal frame regions is disposed along the first frame side in alignment with the spring, and the first thin metal frame region has a thickness and a lateral dimension approximately equal a span of the spring.

In a further embodiment, the frame has a first frame side adjacent to a length of the proof mass, and has a second frame side adjacent to a width of the proof mass. The first sensing structure comprises a first plurality of comb fingers extending from the first body region toward the first frame side and distributed along the length. The second sensing structure comprises a second plurality of comb fingers along the first side, extending from the second body region toward the proof mass, and interdigitated with the first plurality of fingers. The proof mass is physically coupled to the frame through a spring spanning a distance between the proof mass to the first frame side. The spring comprises at least the thin metal layer, but lacks the thick metal layer. The frame comprises thick metal frame regions including the thick metal layer and thin metal frame regions lacking the thick metal layer. A first of the thin metal frame regions is disposed along the second frame side in alignment with the first and second comb fingers and has a dimension approximately equal to that of the first and second comb fingers. A second of the thin metal frame regions is disposed along the first frame side in alignment with the spring. The second thin metal frame region has a thickness and lateral dimension approximately equal a span of the spring.

In embodiments, an integrated accelerometer, includes the MEMS described in any of the exemplary embodiments above, and at least one of an amplifier or acceleration calculator electrically coupled to the MEMS and comprising integrated circuitry including transistors disposed within the substrate.

In embodiments, a Microelectromechanical System (MEMS) gyroscope or accelerometer, comprises a substrate including CMOS circuitry, a released proof mass, and a frame. The released proof mass is electrically coupled to the CMOS circuitry and formed in thin film metal interconnect layers over the CMOS circuitry, and includes a plurality of first coupling fingers cantilevered from the substrate. The proof mass includes a first body region including a thick metal layer separated from a thin metal layer. The thick metal layer has a film thickness that is at least five times greater than that of the thin metal layer. The first coupling fingers comprise the thin metal layer, but lack the thick metal layer. The frame surrounds at least two sides of the proof mass and electrically couples to the CMOS circuitry and forms the thin film metal interconnect layers. The frame includes a plurality of second coupling fingers interdigitated with the first coupling fingers to register a change in capacitance in response to deflection in one or more spring physically connecting the proof mass to the frame. The one or more spring comprises at least the thin metal layer, but lacks the thick metal layer.

In further embodiments, the proof mass further comprises a first plurality of large openings distributed over the first area of the substrate, each of the first large openings extending through the thick metal layer, having a first lateral dimension, and spaced apart by a first spacing that is larger than the gap between the first and second capacitive fingers. The frame further comprises a second plurality of the large openings distributed over a second area of the substrate, each of the second plurality of large openings extending through the thick metal layer, and spaced apart by the first spacing.

In further embodiments, the proof mass and frame have approximately the same static deflection away from the substrate to maintain the first coupling fingers in adjacent to the second coupling fingers over a length of the proof mass.

In embodiments, a mobile computing platform comprises the MEMS gyroscope or accelerometer in any of the exemplary embodiments above, a display screen to display output dependent on an acceleration registered by accelerometer, and a wireless transceiver to relay information dependent on a condition registered by the gyroscope or accelerometer.

In embodiments, a method of forming a Microelectromechanical System (MEMS), the method comprises receiving a substrate, patterning body regions of a proof mass and surrounding frame, patterning sensing structures and releasing the proof mass from the substrate. Body regions of a proof mass and surrounding frame are patterned into a metal film stack including a thick metal layer separated from a thin metal layer by dielectric, the thick metal layer having a film thickness that is at least five times greater than that of the thin metal layer. The sensing structures of the proof mass and frame are patterned into a metal film stack including the thin metal layer, but lacking the thick metal layer.

In further embodiments, releasing the proof mass further comprises releasing the frame to allow the frame to deflect from the substrate by an amount approximately equal to the deflection experienced by the proof mass in response to static stress in the metal film stack.

In further embodiments, the method further comprises patterning a spring coupling between the proof mass and frame into a metal film stack including the thin metal layer, but lacking the thick metal layer. Releasing the proof mass further comprises releasing the frame to allow the frame to deflect from the substrate by an amount approximately equal to the deflection experienced by the proof mass in response to static stress in the metal film stack.

In further embodiments, the thick metal layer is a top level of metal disposed over the thin metal layer. The thin metal layer is one of a plurality of thin metal layers within the metal film stack.

In further embodiments, the method includes anisotropically etching exposed dielectric within the body region of the frame selectively to the metal layers to form large openings having a first critical dimension (CD) through the thick metal layer and through the thin metal layer. In these further embodiments, the method also includes anisotropically etching exposed dielectric within the body region of the proof mass to form the large openings through the thick metal layer vertically aligned with a small opening through the thin metal layer having a second CD, smaller than the first CD.

In further embodiments, the method further includes anisotropically etching exposed dielectric within the body region of the proof mass selectively to the metal layers to form a large opening having a first critical dimension (CD) through the thick metal layer vertically aligned with a plurality of small openings through the thin metal layer having a second CD, smaller than the first CD. In these further embodiments, the method also includes anisotropically etching exposed dielectric within the body region of the frame selectively to the metal layers to form a large opening having the first CD through the thick metal layer vertically aligned with a single opening through the thin metal layer.

In further embodiments, patterning sensing structures of the proof mass and frame further comprises forming first comb fingers connected to the body region of the proof mass and second comb fingers connected to the body region of the frame and interdigitated with the first comb fingers. In these further embodiments, the method further comprises anisotropically etching exposed dielectric between the first and second comb fingers to form a gap there between.

However, the above embodiments are not limited in these regards and, in various implementations, the above embodiments may include the undertaking only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claim are entitled.

What is claimed is:

1. A Microelectromechanical System (MEMS), comprising:
   a substrate;
   a released proof mass disposed over a first area of the substrate and having:
      a first body region comprising a thick metal layer over a thin metal layer, the thick metal layer having a film thickness that is at least five times greater than that of the thin metal layer; and
      a first sensing structure comprising the thin metal layer, but lacking the thick metal layer; and
   a frame disposed over a second area of the substrate, the frame having:
      a second body region comprising at least one of the metal layers; and
      a second sensing structure comprising the thin metal layer, but also lacking the thick metal layer, and separated from the first sensing structure by a gap to register a change in capacitance with displacement of the released proof mass relative to the frame.

2. The MEMS of claim 1, wherein:
the second body region comprises the thin metal layer and the thick metal layer; the frame is at least partially released from the substrate; and
the first and second body regions are both statically deflected from a surface of the substrate.

3. The MEMS of claim 1, wherein:
the second body region comprises the thin metal layer and thick metal layer;
the first body region further comprises a first plurality of large openings distributed over the first body region, each of the first large openings extending through the thick metal layer, having a first lateral dimension that is larger than the gap, and spaced apart by a first spacing; and
the second body region further comprises a second plurality of the large openings distributed over the second area of the substrate, each of the second plurality of large openings extending through the thick metal layer, and spaced apart by the first spacing.

4. The MEMS of claim 1, wherein:
the second body region comprises a metal film stack, including the thick metal layer; the first body region further comprises a first plurality of large openings distributed along a first dimension of the substrate, each of the first large openings extending through the thick metal layer, having a first lateral dimension that is larger than the gap, and spaced apart by a first spacing; and
the second body region further comprises a second plurality of the large openings distributed along the first dimension, each of the second large openings extending through the thick metal layer, and spaced apart by the first spacing, wherein:
   at least one of the first large openings exposes a first lower level opening that extends through at least the thin metal layer and exposes the substrate, the first lower level opening having a second lateral dimension smaller than the first lateral dimension; and
   at least one of the second large openings exposes a second lower level opening that extends through at least the thin metal layer and exposes the substrate, the first lower level opening having a third lateral dimension larger than the second lateral dimension.

5. The MEMS of claim 1, wherein:
the second body region comprises a metal film stack, including the thick metal layer;
the first body region further comprises a first plurality of large openings distributed over the first substrate area, each of the first large openings extending through the thick metal layer, having a first lateral dimension, and spaced apart by a first spacing that is larger than the gap, wherein at least one of the first large openings exposes a plurality of first lower level openings that extend through a plurality of underlying thin metal layers in the stack and expose the substrate; and
the second body region further comprises a second plurality of the large openings distributed across the second substrate area, each of the second large openings extending through the thick metal layer and spaced apart by the first spacing, wherein one of the second large openings exposes only a single second lower level opening that extends through a plurality of underlying thin metal layers in the stack and exposes the substrate.

6. The MEMS of claim 1, wherein:
the frame has a first frame side adjacent to a length of the proof mass, and has a second frame side adjacent to a width of the proof mass, and orthogonal to the first frame side;
the first sensing structure comprises a first plurality of comb fingers extending from the first body region toward the first frame side and distributed along the length;
the second sensing structure comprises a second plurality of comb fingers along the first side, extending from the second body region toward the proof mass, and interdigitated with the first plurality of fingers; and
the frame comprises:
thick metal frame regions including the thick metal layer; and
thin metal frame regions lacking the thick metal layer, wherein a first of the thin metal frame regions is disposed along the second frame side in alignment with the first and second fingers and has a thickness and a lateral dimension approximately equal to that of the first and second comb fingers.

7. The MEMS of claim 1, wherein:
the frame has a first frame side adjacent to a length of the proof mass, and has a second frame side adjacent to a width of the proof mass;
the proof mass is physically coupled to the frame through a spring spanning a distance between the proof mass to the first frame side, the spring comprising at least the thin metal layer, but lacking the thick metal layer; and
the frame comprises:
thick metal frame regions including the thick metal layer; and thin metal frame regions lacking the thick metal layer, wherein a first of the thin metal frame regions is disposed along the first frame side in alignment with the spring, and wherein the first thin metal frame region has a thickness and a lateral dimension approximately equal a span of the spring.

8. The MEMS of claim 1, wherein:
the frame has a first frame side adjacent to a length of the proof mass, and has a second frame side adjacent to a width of the proof mass;
the first sensing structure comprises a first plurality of comb fingers extending from the first body region toward the first frame side and distributed along the length;
the second sensing structure comprises a second plurality of comb fingers along the first side, extending from the second body region toward the proof mass, and interdigitated with the first plurality of fingers;
the proof mass is physically coupled to the frame through a spring spanning a distance between the proof mass to the first frame side, the spring comprising at least the thin metal layer, but lacking the thick metal layer; and
the frame comprises:
thick metal frame regions including the thick metal layer; and thin metal frame regions lacking the thick metal layer, wherein:
a first of the thin metal frame regions is disposed along the second frame side in alignment with the first and second comb fingers and has a dimension approximately equal to that of the first and second comb fingers; and
a second of the thin metal frame regions is disposed along the first frame side in alignment with the spring, and wherein the second thin metal frame region has a thickness and lateral dimension approximately equal a span of the spring.

9. An integrated accelerometer, comprising: the MEMS of claim 1; and
at least one of an amplifier or acceleration calculator electrically coupled to the MEMS and comprising integrated circuitry including transistors disposed on the substrate.

10. A Microelectromechanical System (MEMS) gyroscope or accelerometer, comprising:
a substrate including CMOS circuitry;
a released proof mass electrically coupled to the CMOS circuitry and formed in thin film metal interconnect layers over the CMOS circuitry, and including a plurality of first coupling fingers cantilevered from the substrate, wherein the released proof mass includes a first body region including a thick metal layer separated from a thin metal layer, the thick metal layer having a film thickness that is at least five times greater than that of the thin metal layer, and wherein the first coupling fingers comprise the thin metal layer, but lack the thick metal layer; and
a frame surrounding at least two sides of the proof mass and electrically coupled to the CMOS circuitry and formed in the thin film metal interconnect layers, wherein the frame includes a plurality of second coupling fingers interdigitated with the first coupling fingers to register a change in capacitance in response to deflection in one or more spring physically connecting the proof mass to the frame, the one or more spring comprising at least the thin metal layer, but lacking the thick metal layer.

11. The MEMS gyroscope or accelerometer of claim 10, wherein:
the proof mass further comprises a first plurality of large openings distributed over the first area of the substrate, each of the first large openings extending through the thick metal layer, having a first lateral dimension, and spaced apart by a first spacing that is larger than the gap between the first and second coupling fingers; and
the frame further comprises a second plurality of the large openings distributed over a second area of the substrate, each of the second plurality of large openings extending through the thick metal layer, and spaced apart by the first spacing.

12. The MEMS gyroscope or accelerometer of claim 10, wherein the proof mass and frame have approximately the same static deflection away from the substrate to maintain the first coupling fingers adjacent to the second coupling fingers over a length of the proof mass.

13. A mobile computing platform comprising:
the MEMS gyroscope or accelerometer of claim 10;
a display screen to display output dependent on an acceleration registered by accelerometer; and
a wireless transceiver to relay information dependent on a condition registered by the gyroscope or accelerometer.

14. A method of forming a Microelectromechanical System (MEMS), the method comprising:
receiving a substrate;
patterning body regions of a proof mass and a surrounding frame in a metal film stack including a thick metal layer separated from a thin metal layer by dielectric, the thick metal layer having a film thickness that is at least five times greater than that of the thin metal layer; and
patterning sensing structures of the proof mass and frame into a metal film stack including the thin metal layer, but lacking the thick metal layer; and
releasing the proof mass from the substrate.

15. The method of claim 14, wherein releasing the proof mass further comprises releasing the frame to allow the frame to deflect from the substrate by an amount approximately equal to the deflection experienced by the proof mass in response to static stress in the metal film stack.

16. The method of claim 14, wherein the method further comprises patterning a spring coupling between the proof mass and frame into a metal film stack including the thin metal layer, but lacking the thick metal layer; and wherein releasing the proof mass further comprises releasing the frame to allow the frame to deflect from the substrate by an amount approximately equal to the deflection experienced by the proof mass in response to static stress in the metal film stack.

17. The method of claim 14, wherein the thick metal layer is a top level of metal disposed over the thin metal layer, and wherein the thin metal layer is one of a plurality of thin metal layers within the metal film stack.

18. The method of claim 14, further comprising:

anisotropically etching exposed dielectric within the body region of the frame selectively to the metal layers to form large openings having a first critical dimension (CD) through the thick metal layer and through the thin metal layer; and anisotropically etching exposed dielectric within the body region of the proof mass to form the large openings through the thick metal layer vertically aligned with a small opening through the thin metal layer having a second CD, smaller than the first CD.

19. The method of claim 14, further comprising anisotropically etching exposed dielectric within the body region of the proof mass selectively to the metal layers to form a large opening having a first critical dimension (CD) through the thick metal layer vertically aligned with a plurality of small openings through the thin metal layer having a second CD, smaller than the first CD;

anisotropically etching exposed dielectric within the body region of the frame selectively to the metal layers to form a large opening having the first CD through the thick metal layer vertically aligned with a single opening through the thin metal layer.

20. The method of claim 14, wherein patterning sensing structures of the proof mass and frame further comprises forming first comb fingers connected to the body region of the proof mass and second comb fingers connected to the body region of the frame and interdigitated with the first comb fingers; and wherein the method further comprises anisotropically etching exposed dielectric between the first and second comb fingers to form a gap there between.

* * * * *